(12) United States Patent
Zhong et al.

(10) Patent No.: US 9,607,877 B2
(45) Date of Patent: Mar. 28, 2017

(54) SUBSTRATE STRUCTURE, SEMICONDUCTOR DEVICE, AND METHOD FOR MANUFACTURING THE SAME

(75) Inventors: Huicai Zhong, San Francisco, CA (US); Qingqing Liang, Lagrangeville, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 272 days.

(21) Appl. No.: 13/376,731

(22) PCT Filed: Mar. 4, 2011

(86) PCT No.: PCT/CN2011/071224
§ 371 (c)(1),
(2), (4) Date: Dec. 7, 2011

(87) PCT Pub. No.: WO2012/051820
PCT Pub. Date: Apr. 26, 2012

(65) Prior Publication Data
US 2012/0261790 A1  Oct. 18, 2012

(30) Foreign Application Priority Data
Oct. 21, 2010 (CN) .......................... 2010 1 0520798

(51) Int. Cl.
*H01L 23/34* (2006.01)
*H01L 27/12* (2006.01)
(Continued)

(52) U.S. Cl.
CPC .. *H01L 21/76224* (2013.01); *H01L 21/76283* (2013.01); *H01L 27/0694* (2013.01); *H01L 27/088* (2013.01)

(58) Field of Classification Search
CPC ..... H01L 23/49562; H01L 2224/73221; H01L 24/39; H01L 24/36; H01L 23/481;
(Continued)

(56) References Cited

U.S. PATENT DOCUMENTS 5,144,401 A * 9/1992 Ogura et al. .................. 257/138
5,811,315 A * 9/1998 Yindeepol et al. ........... 438/405
(Continued)

FOREIGN PATENT DOCUMENTS

| CN | 101673701 A | 3/2010 |
|----|-------------|--------|
| CN | 101783314 A | 7/2010 |
| JP | 02054554 A * | 2/1990 |

OTHER PUBLICATIONS

Written Opinion for PCT/CN2011/071224 dated Jul. 21, 2011.
(Continued)

*Primary Examiner* — Mary Wilczewski
*Assistant Examiner* — Tsz Chiu
(74) *Attorney, Agent, or Firm* — Troutman Sanders LLP (57) ABSTRACT

The present invention provides a substrate structure, a semiconductor device, and a manufacturing method thereof. The substrate structure comprises: a semiconductor substrate; and a first isolation region, wherein the first isolation region comprises: a first trench extending through the semiconductor substrate; and a first dielectric layer filling the first trench. Due to the isolation region extending through the substrate, it is possible to make device structures on both surfaces of the substrate, so as to increase the utilization of the substrate and the integration degree of the devices.

22 Claims, 10 Drawing Sheets (51) Int. Cl.
*H05K 7/20* (2006.01)
*H01L 21/762* (2006.01)
*H01L 27/06* (2006.01)
*H01L 27/088* (2006.01)

(58) Field of Classification Search
CPC ... H01L 23/485; H01L 23/492; H01L 23/522; H01L 23/049; H01L 23/3121; H01L 23/4951; H01L 23/50; H01L 23/60; H01L 23/051
USPC .......... 257/520, 508, 513, E21.564, E23.105
See application file for complete search history.

(56) References Cited

U.S. PATENT DOCUMENTS

| | | | |
|---|---|---|---|
| 6,249,015 B1 * | 6/2001 | Matsuo et al. | 257/296 |
| 6,281,095 B1 * | 8/2001 | Bolam et al. | 438/462 |
| 6,492,684 B2 * | 12/2002 | Bolam et al. | 257/349 |
| 6,617,223 B2 * | 9/2003 | Wilson et al. | 438/404 |
| 6,787,876 B2 * | 9/2004 | Wilson | 257/520 |
| 8,552,815 B2 * | 10/2013 | Fujii | H01P 3/121 333/248 |
| 2002/0036330 A1 * | 3/2002 | Kobayashi | 257/407 |
| 2008/0124889 A1 * | 5/2008 | Roggenbauer et al. | 438/404 |
| 2008/0224257 A1 | 9/2008 | Mori | |
| 2009/0127624 A1 | 5/2009 | Sumitomo et al. | |
| 2010/0308941 A1 * | 12/2010 | Fujii | H01P 11/001 333/243 |

OTHER PUBLICATIONS

Office Action issued on Aug. 19, 2015 from UKIPO in counterpart UK Patent Application No. 1202556.5.
Office Action dated Jan. 7, 2016 issued in UKIPO in counterpart UK Patent Application No. 1202556.5.
Office Action, dated May 10, 2016, issued in corresponding British Patent Application No. GB1202556.5.

* cited by examiner

SUBSTRATE STRUCTURE, SEMICONDUCTOR DEVICE, AND METHOD FOR MANUFACTURING THE SAME

BENEFIT CLAIMS

This application is a National Phase application of, and claims priority to, PCT Application No. PCT/CN2011/071224, filed on Mar. 4, 2011, entitled "substrate structure, semiconductor device, and method for manufacturing the same", which claimed priority to Chinese Application No. 201010520798.4, filed on Oct. 21, 2010. Both the PCT Application and Chinese Application are incorporated herein by reference in their entireties.

FIELD OF THE INVENTION

The present invention relates to semiconductor manufacture, and particularly relates to a substrate structure, a semiconductor device, and a method for manufacturing the same.

BACKGROUND

With rapid development of semiconductor technology, integrated circuits having enhanced performances and functions require larger element density, and components such as CMOS devices and metal interconnects need to be further scaled down. Accordingly, the integration degree of devices needs to keep increasing. Isolation structure is a component for isolating active regions of respective elements. Currently, Shallow Trench Isolation (STI) is a typical isolation structure for isolating active regions. The STI is formed on one surface of a substrate and is a shallow trench in the substrate filled with dielectrics. Therefore, it is only possible to fabricate devices on one surface of the substrate, which is disadvantageous for increasing the utilization of substrate and the integration degree of devices.

SUMMARY OF THE INVENTION

In view of the above problems, according to an aspect of the present invention, there is provided a substrate structure, comprising: a semiconductor substrate; and a first isolation region, wherein the first isolation region comprises: a first trench extending through the semiconductor substrate; and a first dielectric layer filling the first trench.

According to a further aspect of the present invention, there is provided a substrate structure, comprising: a semiconductor substrate; and a second isolation region, wherein the second isolation region comprises: a second trench extending through the semiconductor substrate; a second dielectric layer formed on sidewalls of the second trench; and a first heat dissipating layer filling a space between inner walls of the second dielectric layer.

According to a still further aspect of the present invention, there is provided a substrate structure, comprising: a semiconductor substrate; and a third isolation region, wherein the third isolation region comprises: a third trench extending through the semiconductor substrate; a second heat dissipating layer formed on sidewalls of the third trench; and a third dielectric layer filling a space between inner walls of the second heat dissipating layer.

According to a still further aspect of the present invention, there is provided a semiconductor device formed on an upper surface and/or a lower surface of any of the above semiconductor substrate structure.

According to a still further aspect of the present invention, there is provided a method for manufacturing the above semiconductor substrate structure, comprising: A) providing a semiconductor substrate; B) forming a supporting layer on the semiconductor substrate; C) forming a trench extending through the semiconductor substrate and exposing the supporting layer, and filling the trench to form an isolation region; and D) removing the supporting layer.

According to a yet further aspect of the present invention, there is provided a method for manufacturing a semiconductor device, comprising forming the semiconductor device on an upper surface and/or a lower surface of the above substrate structure.

By forming a substrate structure having an isolation region extending through the substrate, it is possible to form device structures on both surfaces of the substrate, so as to increase the utilization of substrate and the integration density of devices.

DETAILED DESCRIPTION OF THE PREFERRED EMBODIMENTS

The present invention generally relates to a method for manufacturing a semiconductor device. The following disclosure provides many different embodiments or examples to exemplify different implementations of the present invention. In order to simplify the disclosure of the present invention, the following descriptions are only made on specific exemplary components and arrangements. It is apparent that they are only for illustrating rather than limiting the present invention. Further, in the present disclosure, reference numbers and/or letters may be iterated through different examples. Such iterations are for purpose of simplification and clarity rather than indicating relationships between various embodiments and/or arrangements discussed here. In addition, the present disclosure provides various specific examples of processes and materials. However, those skilled in the art will appreciate applications of other processes and/or other materials. Furthermore, in the following an arrangement in which a first feature is described to be "on" a second feature may include an embodiment, in which the first and second features are formed in a direct contact, and also an embodiment, in which another structure is interposed between the first and second features so that the first and second features may not contact each other directly.

Figure 7:
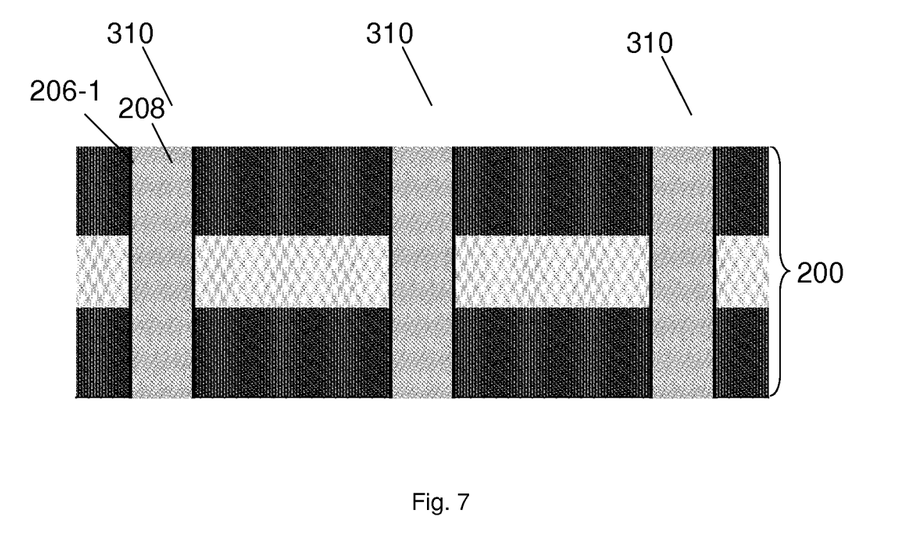

FIG. 7 shows a first embodiment of a substrate structure of the present invention. In the first embodiment, the substrate structure comprises: a semiconductor substrate 200; and a first isolation region 310, wherein the first isolation region 310 comprises: a first trench 206-1 extending through the semiconductor substrate 200; and a first dielectric layer 208 filling the first trench 206-1.

Figure 8:
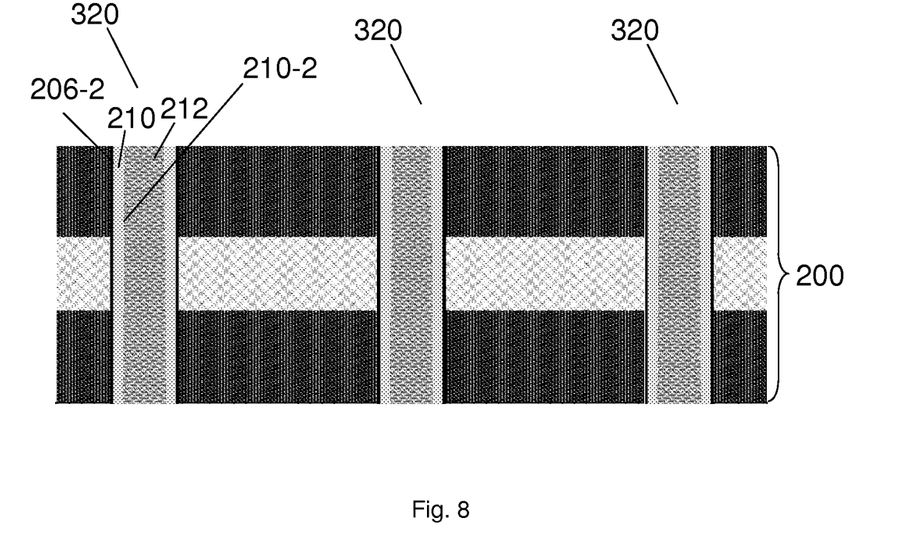

FIG. 8 shows a second embodiment of a substrate structure according to the present invention. In the second embodiment, the substrate structure comprises a semiconductor substrate 200 and a second isolation region 320, wherein the second isolation region 320 comprises: a second trench 206-2 extending through the semiconductor substrate 200; a second dielectric layer 210 formed on sidewalls of the second trench 206-2; and a first heat dissipating layer 212 filling a space between inner walls 210-2 of the second dielectric layer 210.

Figure 9:
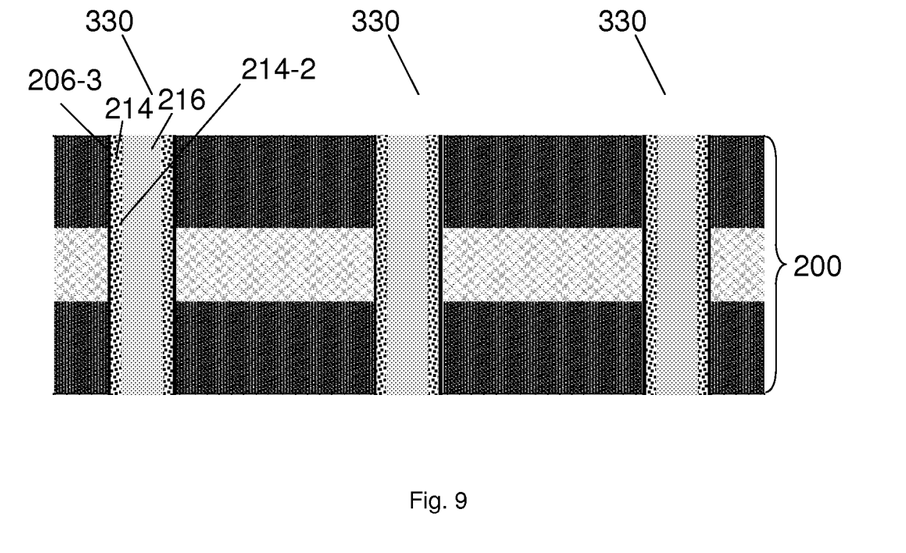

FIG. 9 shows a third embodiment of a substrate structure according to the present invention. In the third embodiment, the substrate structure comprises a semiconductor substrate 200 and a third isolation region 330, wherein the third isolation region 330 comprises: a third trench 206-3 extending through the semiconductor substrate 200; a second heat dissipating layer 214 formed on sidewalls of the third trench 206-3; and a third dielectric layer 216 filling a space between inner walls 214-2 of the second heat dissipating layer 214. In this embodiment, the third isolation region 330 has functions for both isolation and heat dissipation.

Figure 20:
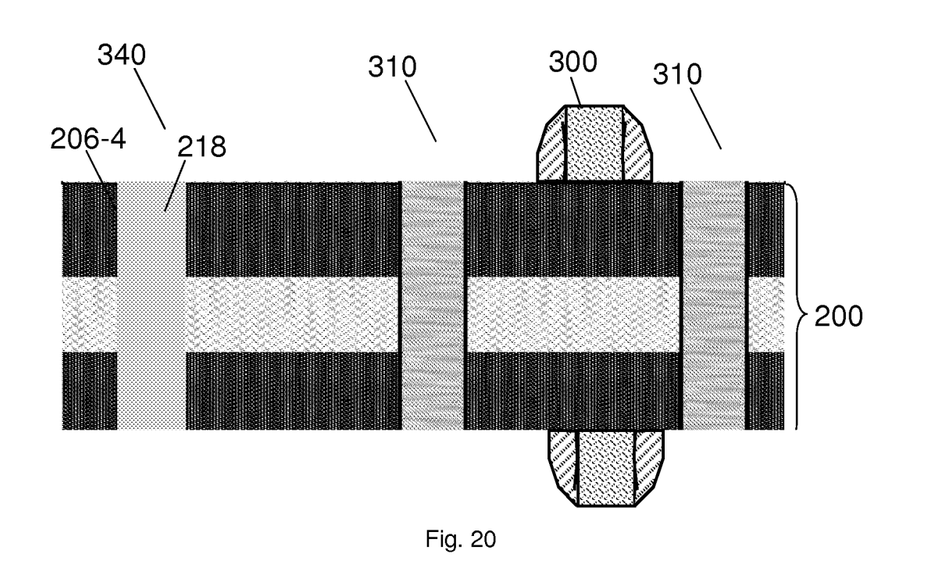

In the first embodiment, optionally, the substrate structure may further comprise one or more of the following features: the second isolation region according to the second embodiment, the third isolation region according the third embodiment, and a heat dissipating region, wherein the heat dissipating region 340 (referring to FIG. 20) comprises: a fourth trench 206-4 extending through the semiconductor substrate 200; and a third heat dissipating layer 218 filling the fourth trench 206-4.

In the second embodiment, optionally, the substrate structure may further comprise one or more of the following features: the first isolation region according to the first embodiment, the third isolation region according to the third embodiment, and the above described heat dissipating region.

In the third embodiment, optionally, the substrate structure may further comprise the above described heat dissipating region. In the above embodiments, the semiconductor substrate may comprise a Silicon-On-Insulator (SOI) structure, as shown in FIG. 7. In further embodiments, the substrate may comprise a silicon substrate (e.g. a wafer), a substrate of other semiconductor, or a compound semiconductor substrate, e.g. Ge, SiGe, GaAs, InP, or SiC, etc. The substrate may comprise various doping configurations, for example, according to known design requirements in the prior art (e.g. for a p-type substrate or for an n-type substrate). Further, the substrate 200 may optionally comprise an epitaxial layer, on which stress may be applied for performance enhancement. In the above embodiments, the first dielectric layer, the second dielectric layer, and the third dielectric layer each may comprise an insulating material, such as nitride, oxide, low-K dielectric material, or other materials, or any combination thereof. The first heat dissipating layer, the second heat dissipating layer, and the third heat dissipating layer each may comprise a metal material.

The semiconductor substrate structure having a through substrate isolation has been described in detail. Due to the isolation region extending through the substrate, it is possible to make device structures on both surfaces of the substrate, so as to increase the utilization of the substrate and the integration degree of devices. According to a preferred embodiment, the substrate may further comprise a heat dissipating region to improve the heat dissipation for devices.

The present invention further provides a semiconductor device having the above described substrate structure. As shown in FIGS. 17-20, the semiconductor device 300 is formed on an upper surface and/or a lower surface of the substrate structure according to any of the above described embodiments. The semiconductor device may include a transistor, a diode, or other electronic devices. The drawings are only for illustration and not intended to limit the present invention.

The embodiments of the substrate structure and semiconductor device according to the present invention have been described in detail. Steps for forming the substrate structure and the semiconductor device will be described in detail for a better understanding of the present invention.

Figure 1:
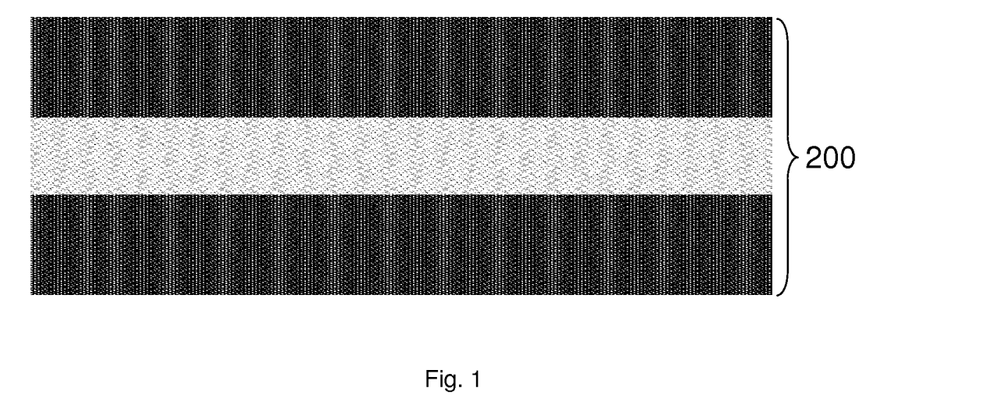
FIGS. 1-16 are structural diagrams schematically showing respective manufacturing stages of a substrate structure according to embodiments of the present invention.

In step S01, a semiconductor substrate 200 is provided, as shown in FIG. 1. The semiconductor substrate 200 is the same as that in the above described embodiments, so detailed descriptions thereof are omitted.

Figure 2:
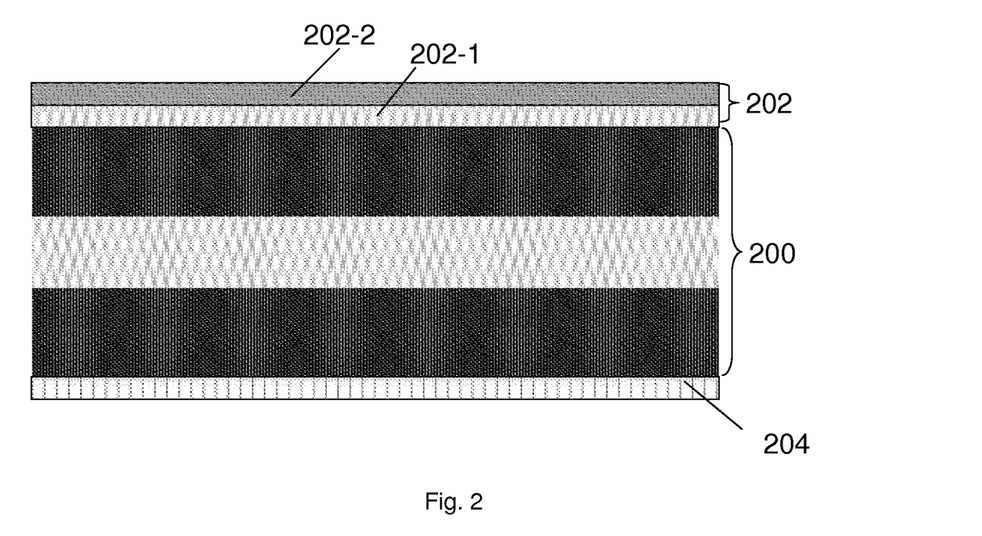

In step S02, a supporting layer 204 is formed on the semiconductor substrate 200, as shown in FIG. 2. The supporting layer 204 may be formed by depositing nitride or oxide (e.g. $SiO_2$ or $Si_3N_4$) on the semiconductor substrate 200. In further embodiments, the supporting layer 204 may comprise other suitable materials, such as metal materials or semiconductor materials different from the material of the semiconductor substrate. The supporting layer 204 should be sufficiently thick to carry the semiconductor substrate 200. For example, the thickness of the supporting layer 204 may be 50 □m~200 □m, e.g. 100 □m. The supporting layer 204 may be formed by a deposition process.

In step S03, a trench extending through the semiconductor substrate and exposing the supporting layer is formed, and then is filled up to form an isolation region.

Figure 3:
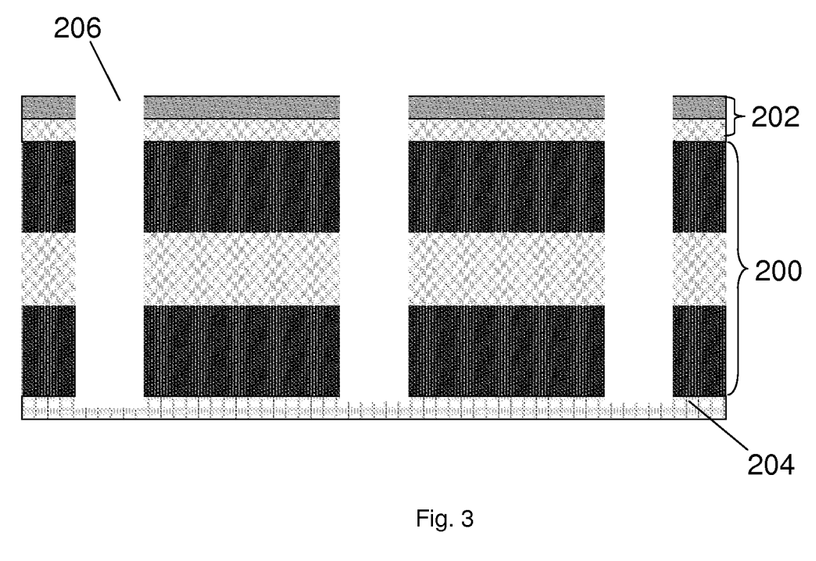

In particular, firstly, a hard mask 202 may be formed on the surface of the semiconductor substrate 200 opposite to the supporting layer 204. In an embodiment of the present invention, a pad oxide layer 202-1 and a pad nitride layer 202-2 may be sequentially deposited on the semiconductor substrate 200, as shown in FIG. 2. The pad oxide layer 202-1 may comprise silicon dioxide, etc., which may be formed typically by a thermal oxidation process. The pad nitride layer 202-2 may comprise silicon nitride, which may be formed typically by a chemical vapor deposition process. The pad oxide layer 202-1 and the pad nitride layer 202-2 are then patterned using a mask and by means of, for example, Reactive Ion Etching (RIE), so as to form the hard mask 202 with trenches therein. Then, the semiconductor substrate 200 is etched using the hard mask 202 as a mask and by means of etching, e.g. RIE, with the supporting layer 204 serving as a stopper layer, so as to form through substrate trenches 206, as shown in FIG. 3.

Figure 4:
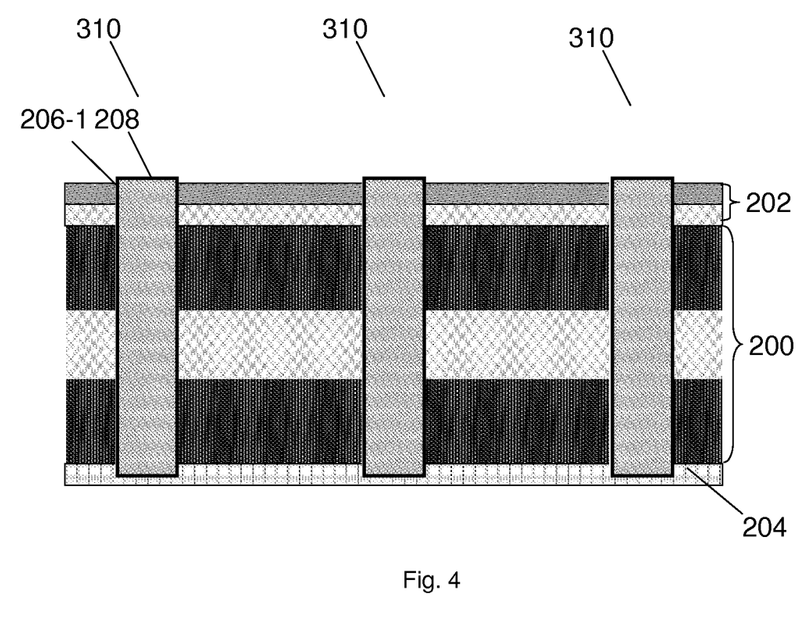

In the first embodiment, as shown in FIG.4, each of the trenches may be a first trench 206-1 exposing the supporting layer 204. Each of the first trenches 206-1 is filled with a first dielectric layer 208, so as to form a first isolation structure 310 filled with only the first dielectric layer 208.

Figure 10:
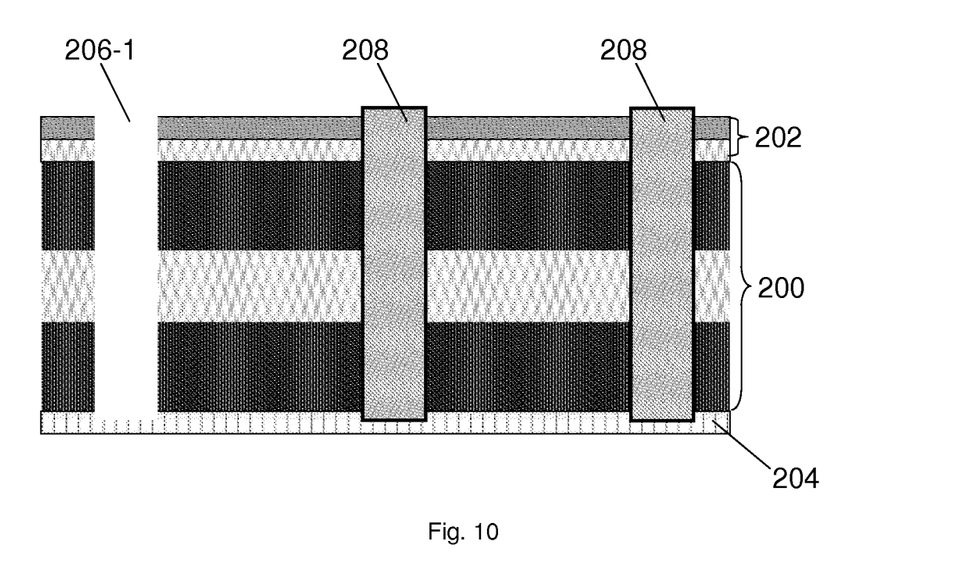
Figure 11:
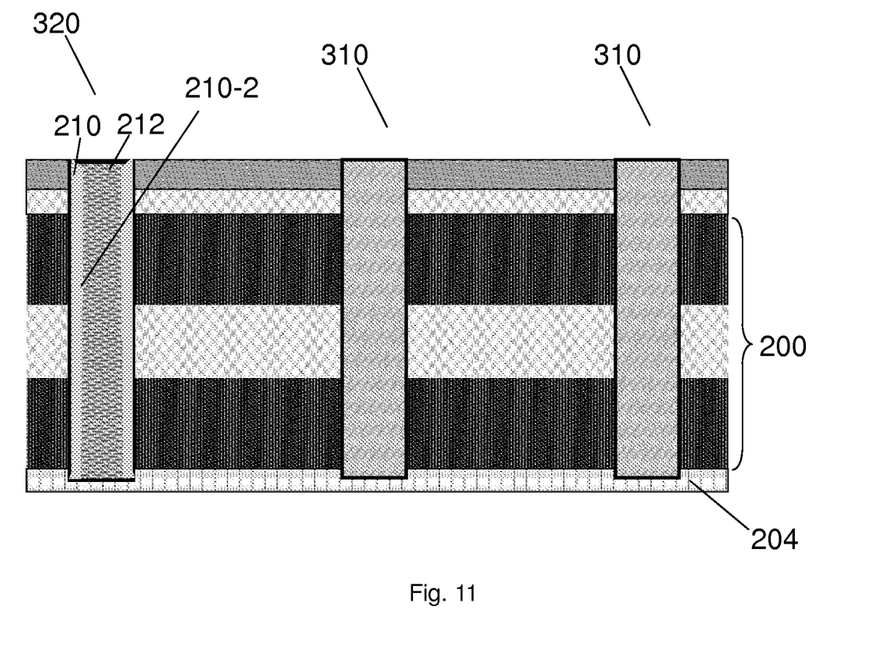
Figure 12:
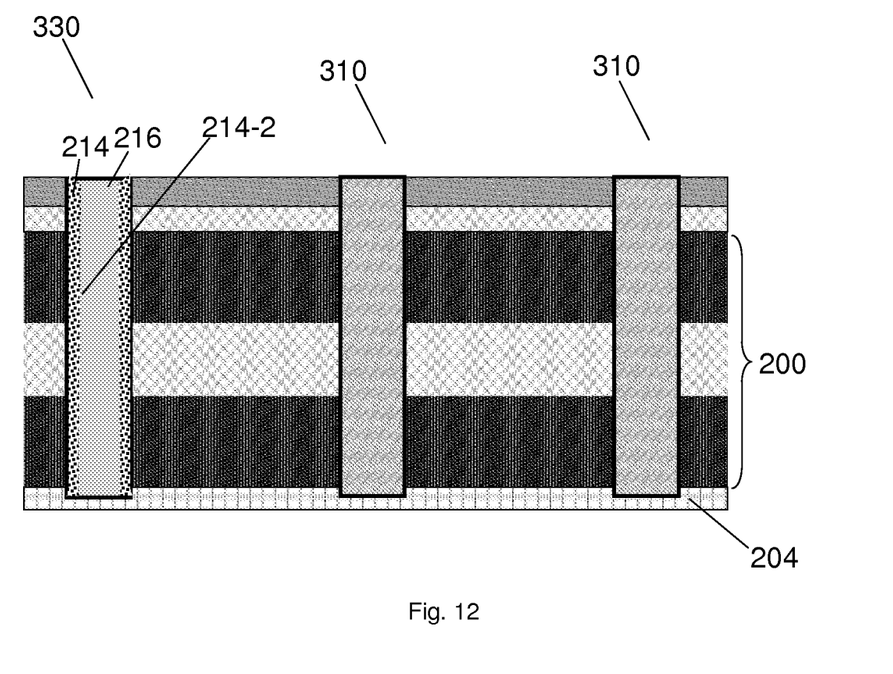
Figure 13:
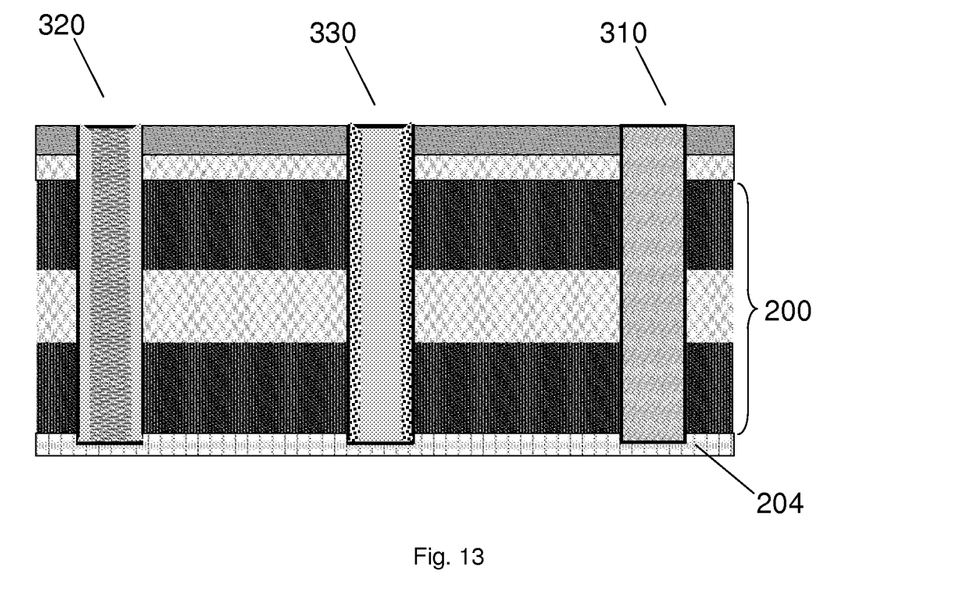
Figure 14:
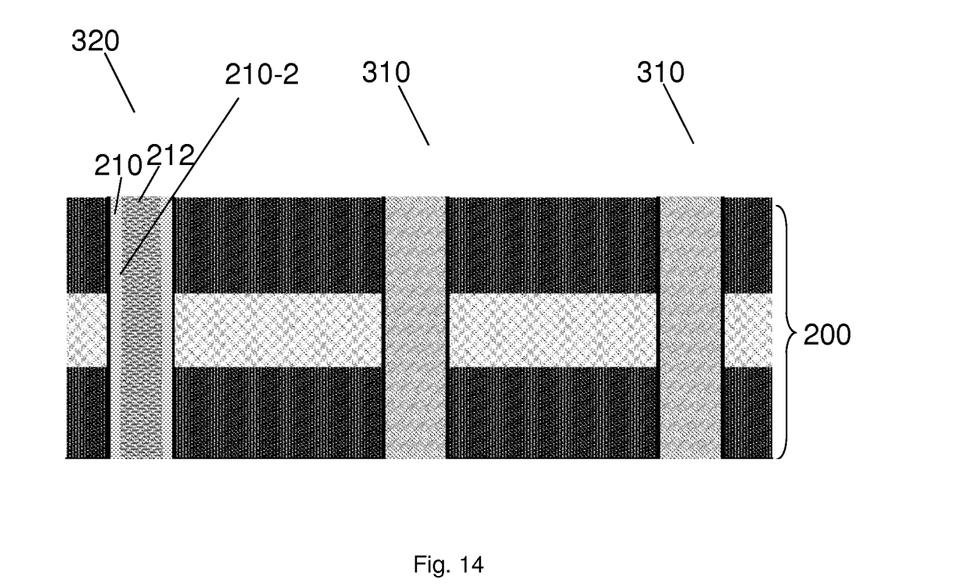
Figure 15:
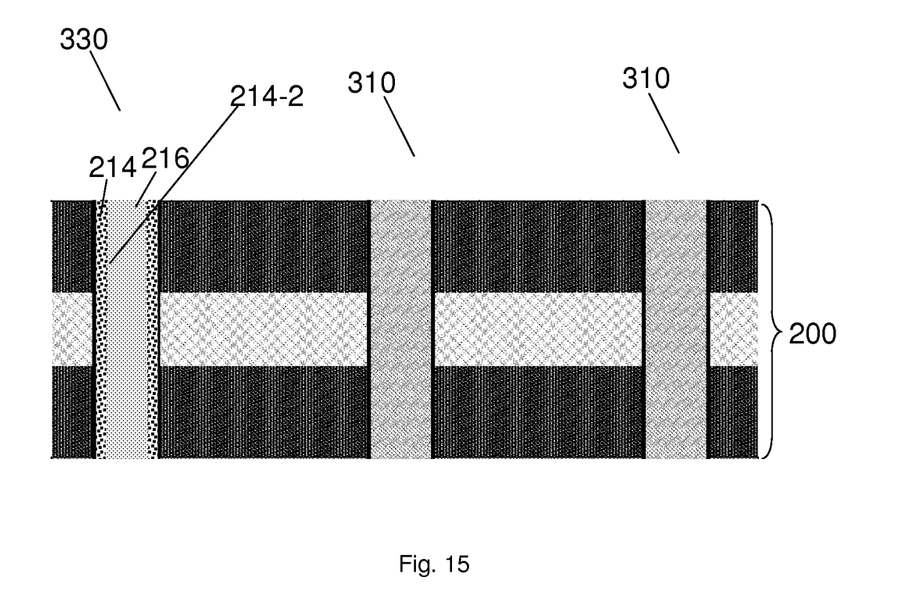
Figure 16:
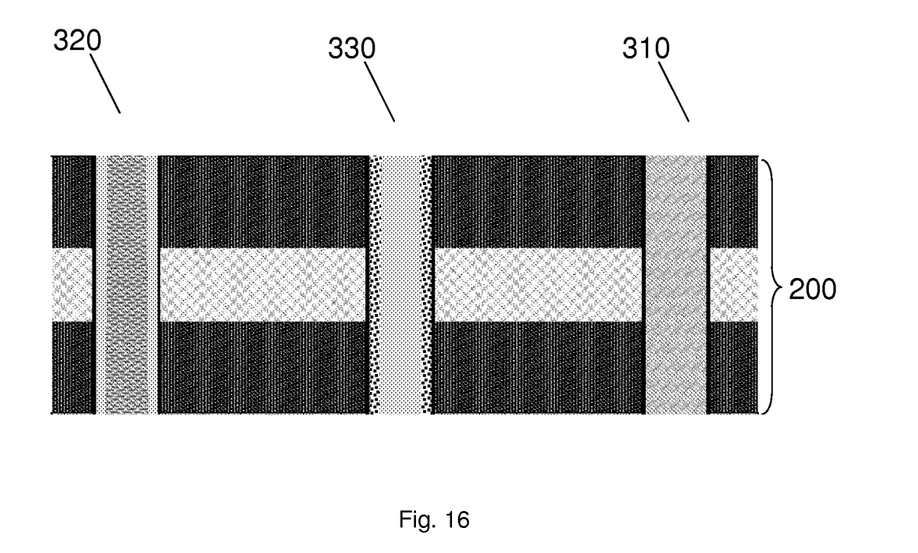
Figure 17:
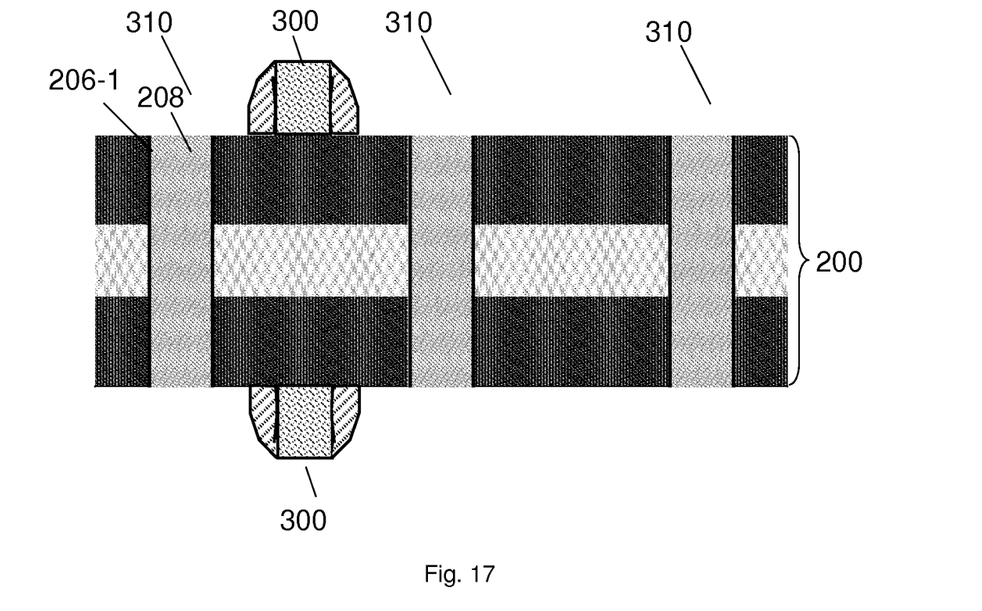
FIGS. 17-20 are structural diagrams schematically showing semiconductor devices according to some embodiments of the present invention.
Figure 18:
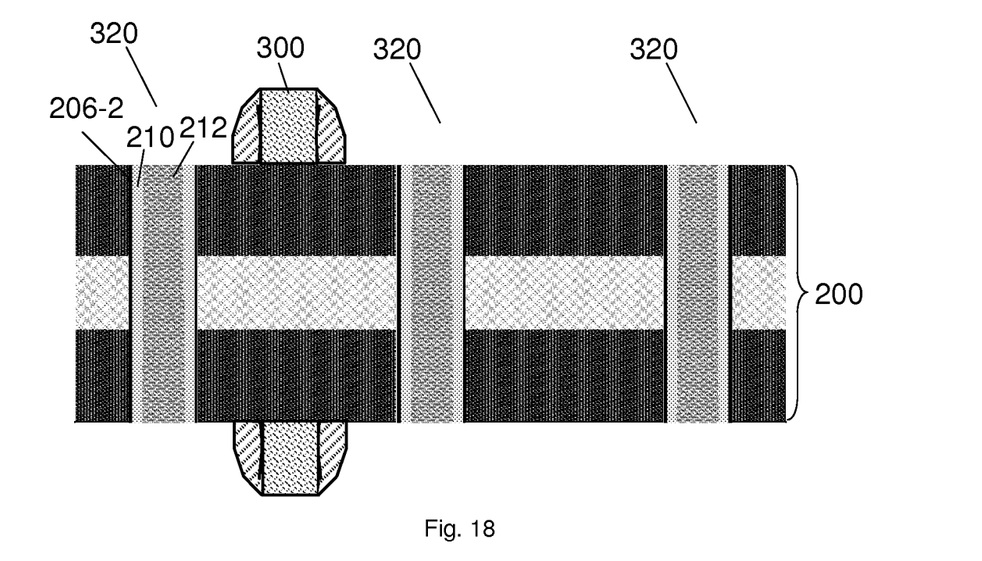
Figure 19:
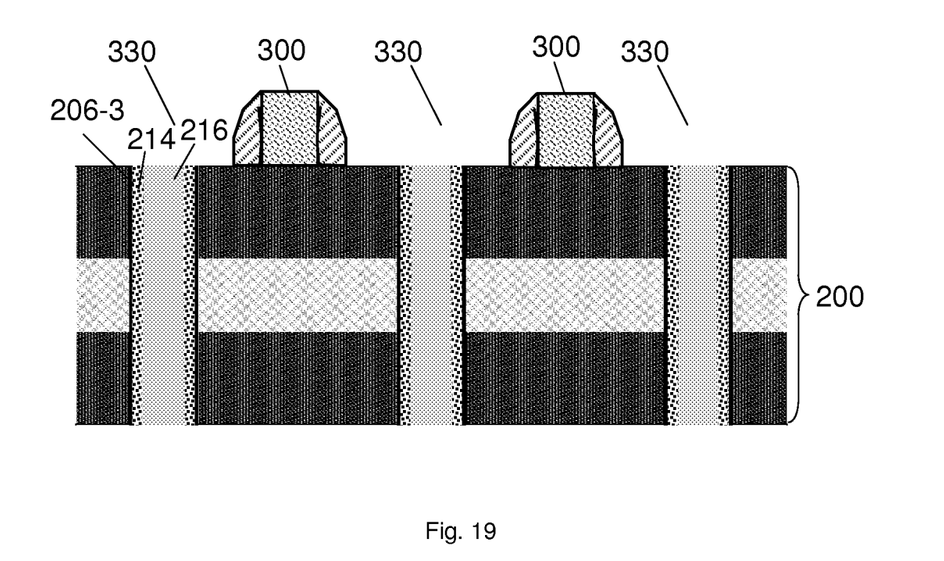

Optionally, the following steps may be performed. The first dielectric layer 208 in some of the first trenches 206-1 is removed to recover some of the first trenches 206-1, as shown in FIG. 10. In an example, a second dielectric layer 210 is formed on sidewalls of the respective recovered first trench(es) 206-1. The space between inner walls 210-2 of the second dielectric layer 210 is filled with a first heat dissipating layer 212, so as to form a second isolation structure 320 having the second dielectric layer 210 on the sidewalls and filled with the first heat dissipating layer 212, as shown in FIG. 11. Alternatively, in a further example, a second heat dissipating layer 214 is formed on sidewalls of the respective recovered first trench(es) 206-1. The space between inner walls 214-2 of the second heat dissipating layer 214 is filled with a third dielectric layer 216, so as to form a third isolation structure 330 having the second heat dissipating layer 214 on the sidewalls and filled with the third dielectric layer 216, as shown in FIG. 12. Alternatively, in a still further embodiment, a third heat dissipating layer 218 is filled in the respective recovered first trench(es) 206-1, so as to form a heat dissipating region 340. A substrate structure having all the first isolation region structure 310, the second isolation region structure 320, and the third isolation region structure 330 is shown in FIG. 13.

Optionally, according to actual requirements, some of the already formed isolation structures may be removed to recover some first trenches 206-1, and materials which are different from those of the already formed isolation structures may be filled into the recovered trenches, so as to form various kinds of isolation region structures in a single semiconductor substrate 200. Alternatively, there may be a heat dissipating structure in the semiconductor substrate 200 in addition to the isolation region structures, to meet design requirements. Furthermore, a substrate structure comprising a combination of the first isolation region structure 310 with any one of the second isolation region structure 320, the third isolation region structure 330, and the heat dissipating region 340 may be fabricated by repeating the steps of masking, etching, and filling. As an example, when the semiconductor substrate 200 comprises the first isolation region structure 310, the third isolation region structure 330, and the heat dissipating region 340, a first trench may firstly be formed in the semiconductor substrate 200, and then, the first isolation region structure 310 may be formed in the first trench. Next, a third trench is formed in the remaining region of the semiconductor substrate 200, and the third isolation region structure 330 is formed in the third trench. Finally, a fourth trench is formed in a region other than the regions where the first isolation region structure 310 or the third isolation region structure 330 are formed, and then the heat dissipating region 340 is formed in the fourth trench. The method for forming a semiconductor substrate 200 comprising a combination of the isolation region structures and the heat dissipating region is similar to that described above, so detailed descriptions thereof are omitted.

Figure 5:
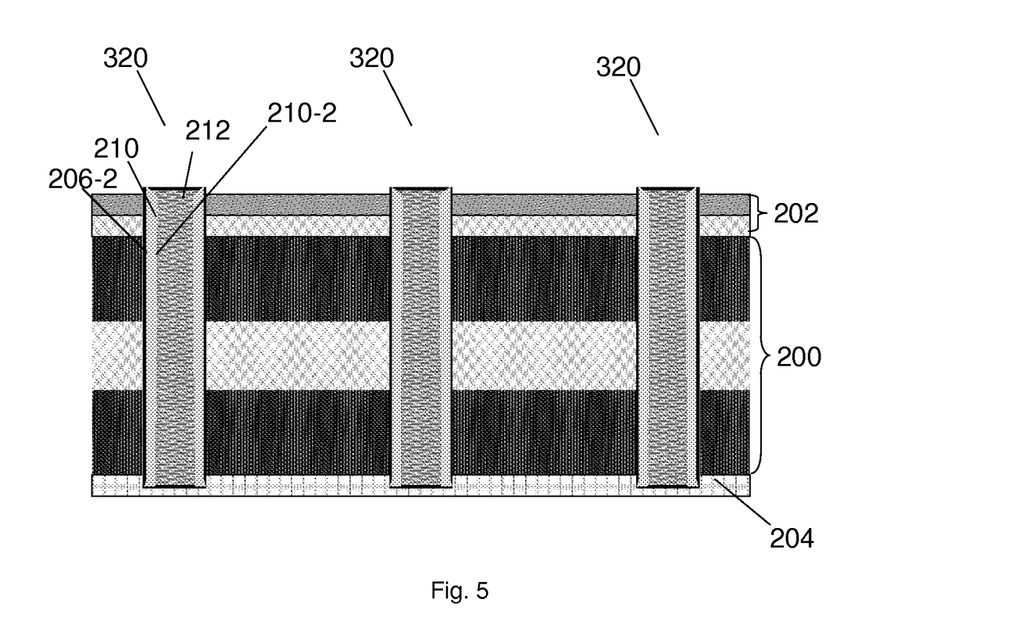

In the second embodiment, only the differences of the second embodiment from the first embodiment are described, and contents that are common to the first and the second embodiments will not be described in detail. As shown in FIG. 5, second trenches 206-2 exposing the supporting layer 204 are formed. A second dielectric layer 210 is formed on sidewalls of the respective second trenches 206-2. The space between inner walls 210-2 of the second dielectric layer 210 is filled with a first heat dissipating layer 212, so as to form a second isolation region structure 320 having the second dielectric layer on the sidewalls and filled with the first heat dissipating layer. Optionally, a substrate structure comprising a combination of the second isolation region structure 320 with at least one of the first isolation region structure 310, the third isolation region structure 330, and the heat dissipating region 340 may be formed using a method similar to that described in the first embodiment (filling all of the second trenches, recovering some of the second trenches, and then forming other isolation region structure(s) or heat dissipating region in the recovered second trench(es); or alternatively, etching respective trenches in different steps and thus forming the respective isolation region structures or heat dissipating region in different steps), so as to form the substrate structure comprising the second isolation region structure 320 or a combination of the second isolation region structure 320 with any one of the first isolation region structure 310, the third isolation region structure 330, and the heat dissipating region 340.

Figure 6:
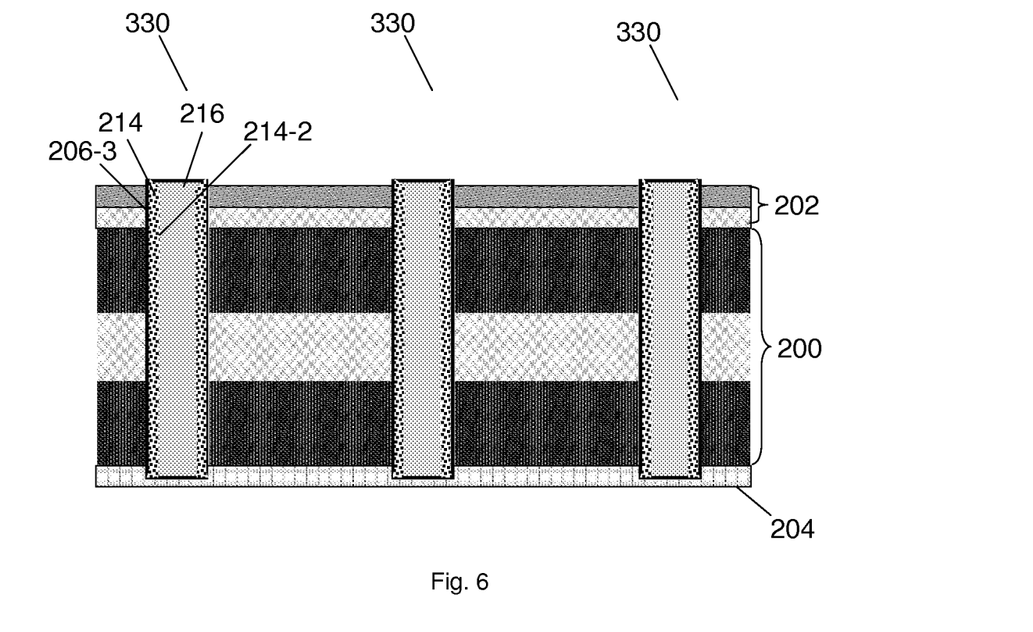

In the third embodiment, only differences of the third embodiment from the first embodiment and the second embodiment are described, and the common contents will not be described in detail. As shown in FIG. 6, third trenches 206-3 exposing the supporting layer 204 may be formed. A second heat dissipating layer 214 is formed on sidewalls of the respective third trenches 206-3. The space between inner walls 214-2 of the second heat dissipating layer 214 is filled with a third dielectric layer 216, so as to form a third isolation region structure 330 having sidewalls of the second heat dissipating layer and filled with the third dielectric layer. Optionally, a substrate structure comprising a combination of the third isolation region structure 330 with at least one of the first isolation region structure 310, the second isolation region structure 320, and the heat dissipating region 340 may be formed using a method similar to that described in the first and the second embodiments, so as to form the substrate structure comprising the third isolation region structure 330 or a combination of the third isolation region structure 330 with any one of the first isolation region structure 310, the second isolation region structure 320, and the heat dissipating region 340.

Then, a planarization process is performed to remove the hard mask 202 and the filling materials therein until the substrate is exposed.

In the above embodiments, the first dielectric layer, the second dielectric layer, and the third dielectric layer each comprise insulating material(s) such as nitride, oxide, low-K dielectric materials, or other materials, or any combination thereof. The first heat dissipating layer, the second heat dissipating layer, and the third heat dissipating layer each comprise metal material(s).

In step S04, the supporting layer 204 is removed. The supporting layer 204 may be removed by means of, for example, CMP or wet etching, to expose the substrate and thus form the substrate structure, as shown in FIGS. 7-9 and FIGS. 14-16, respectively. The drawings are only illustrative and not intended to limit the present invention.

Next, referring to FIGS. 7-9 and FIGS. 17-20, according to actual requirements, a semiconductor device 300 may be formed on an upper surface and/or a lower surface of any of the above described substrate structures. The semiconductor device may include a transistor, a diode, or other electronic devices. The drawings are only illustrative and not intended to limit the present invention.

A semiconductor substrate having a through isolation structure, a semiconductor device, and methods for manufacturing the same have been described in detail.

Since the isolation region extends through the substrate, it is possible to make device structures on both surfaces of the substrate, so as to increase the utilization of substrate and the integration degree of devices. According to a preferred embodiment, a heat dissipating region may be further formed to improve the heat dissipating performance of the devices.

The exemplary embodiments and advantages thereof have been explained in detail. However, various changes, substitutions and modifications may be made to the embodiments without departing from the spirit of the present invention and the scope defined by the attached claims. As for other examples, those skilled in the art will understand that the order of the process steps may be changed without departing from the scope of the present invention.

Furthermore, the scope of the present invention is not limited to the processes, mechanisms, manufactures, compositions, means, methods and steps in the specific embodiments as described in the specification. According to the disclosure of present invention, a person skilled in the art will readily appreciate that processes, mechanisms, manufactures, compositions, means, methods and steps currently existing or to be developed in the future, which perform functions or achieve effects substantially same as those described in corresponding embodiments of the present invention, can be applied under the teaching of the present invention. Therefore, the scope of the attached claims covers all of those processes, mechanisms, manufactures, compositions, means, methods and steps.

What is claimed is:

1. A substrate structure, comprising:
a semiconductor substrate comprising a first side and a second side opposing the first side, wherein at least one of the first side and the second side is configured as a device forming side;
a first isolation region,
wherein the first isolation region includes a first trench extending through the semiconductor substrate from the first side to the second side, and wherein the first trench is filled with only a first dielectric layer; and
a third isolation region, wherein the third isolation region comprises: a third trench extending through the semiconductor substrate from the first side to the second side; a second heat dissipating layer formed on sidewalls of the third trench; and a third dielectric layer filling a space of the third trench between inner walls of the second heat dissipating layer,
wherein the sidewalls of the third trench surround the second heat dissipating layer, and the second dissipating layer surrounds the third dielectric layer.

2. The substrate structure according to claim 1, further comprising a second isolation region, wherein the second isolation region comprises: a second trench extending through the semiconductor substrate from the first side to the second side; a second dielectric layer formed on sidewalls of the second trench; and a first heat dissipating layer filling a space of the second trench between inner walls of the second dielectric layer.

3. The substrate structure according to claim 2, wherein the second dielectric layer comprises an insulating layer, and the first heat dissipating layer comprises a metal material.

4. The substrate structure according to claim 1, further comprising a heat dissipating region, wherein the heat dissipating region comprises: a fourth trench extending through the semiconductor substrate from the first side to the second side; and a third heat dissipating layer filling the fourth trench.

5. The substrate structure according to claim 4, wherein the third heat dissipating layer comprises a metal material.

6. The substrate structure according to claim 1, wherein the first dielectric layer and the third dielectric layer each comprise an insulating material.

7. The substrate structure according to claim 1, wherein the second heat dissipating layer comprises a metal material.

8. A semiconductor device formed on the first side and/or the second side of the substrate structure according to claim 1.

9. A substrate structure, comprising:
a semiconductor substrate comprising a first side and a second side opposing the first side, wherein at least one of the first side and the second side is configured as a device forming side;
a second isolation region; and
a third isolation region,
wherein the second isolation region comprises: a second trench extending through the semiconductor substrate from the first side to the second side; a second dielectric layer formed on sidewalls of the second trench; and a first heat dissipating layer filling a space of the second trench between inner walls of the second dielectric layer,
wherein the third isolation region comprises: a third trench extending through the semiconductor substrate from the first side to the second side; a second heat dissipating layer formed on sidewalls of the third trench; and a third dielectric layer filling a space of the third trench between inner walls of the second heat dissipating layer, and
wherein the sidewalls of the third trench surround the second heat dissipating layer, and the second dissipating layer surrounds the third dielectric layer.

10. The substrate structure according to claim 9, further comprising a first isolation region, wherein the first isolation region comprises: a first trench extending through the semiconductor substrate from the first side to the second side; and a first dielectric layer filling the first trench.

11. The substrate structure according to claim 10, wherein the first dielectric layer comprises an insulating material.

12. The substrate structure according to claim 9, further comprising a heat dissipating region, wherein the heat dissipating region comprises: a fourth trench extending through the semiconductor substrate from the first side to the second side; and a third heat dissipating layer filling the fourth trench.

13. The substrate structure according to claim 12, wherein the third heat dissipating layer comprises a metal material.

14. The substrate structure according to claim 9, wherein the second dielectric layer and the third dielectric layer each comprise an insulating material.

15. The substrate structure according to claim 9, wherein the first heat dissipating layer and the second heat dissipating layer each comprise a metal material.

16. A semiconductor device formed on the first side and/or the second side of the substrate structure according to claim 9.

17. A substrate structure, comprising:
a semiconductor substrate comprising a first side and a second side opposing the first side, wherein at least one of the first side and the second side is configured as a device forming side; and
a third isolation region,
wherein the third isolation region comprises: a third trench extending through the semiconductor substrate from the first side to the second side; a second heat dissipating layer formed on sidewalls of the third trench; and a third dielectric layer filling a space of the third trench between inner walls of the second heat dissipating layer, and
wherein the sidewalls of the third trench surround the second heat dissipating layer, and the second dissipating layer surrounds the third dielectric layer.

18. The substrate structure according to claim 17, further comprising a heat dissipating region, wherein the heat dissipating region comprises: a fourth trench extending through the semiconductor substrate from the first side to the second side; and a third heat dissipating layer filling the fourth trench.

19. The substrate structure according to claim 18, wherein the third heat dissipating layer comprises a metal material.

20. The substrate structure according to claim 17, wherein the third dielectric layer comprises an insulating material.

21. The substrate structure according to claim 17, wherein the second heat dissipating layer comprises a metal material.

22. A semiconductor device formed on the first side and/or the second side of the substrate structure according to claim 17.

* * * * *